United States Patent
Kawai et al.

(10) Patent No.: US 6,203,860 B1
(45) Date of Patent: Mar. 20, 2001

(54) THIN FILM OF POTASSIUM NIOBATE PROCESS FOR PRODUCING THE THIN FILM AND OPTICAL DEVICE USING THE THIN FILM

(75) Inventors: Hideki Kawai; Hidekazu Hashima; Sadao Nakajima, all of Hyogo (JP)

(73) Assignee: Yamamura Glass Co., Ltd., Hyogo (JP)

( * ) Notice: Subject to any disclaimer, the term of this patent is extended or adjusted under 35 U.S.C. 154(b) by 0 days.

(21) Appl. No.: 09/128,999

(22) Filed: Aug. 4, 1998

Related U.S. Application Data

(62) Division of application No. 08/688,273, filed on Jul. 29, 1996, now Pat. No. 5,824,419.

(30) Foreign Application Priority Data

Jul. 28, 1995 (JP) .................................................... 7-212859

(51) Int. Cl.⁷ .................................................... B32B 17/00
(52) U.S. Cl. .......................... 427/497; 427/498; 427/585
(58) Field of Search .................................... 427/497, 498, 427/585

(56) References Cited

U.S. PATENT DOCUMENTS

| | | |
|---|---|---|
| 5,512,383 | 4/1996 | Chikuma et al. |
| 5,824,419 * | 10/1998 | Kawai .................................. 428/432 |

OTHER PUBLICATIONS

Xu, "Ferroelectric Thin Films on Silicon and Fused Silica Substrates by Sol–gel Process", Met. Res. Soc. Symp. Proc, 200, 13–18, 1990.*

Swartz, "Ferroelectric Thin Films by Sol–gel Processing", Mat. Res. Soc. Symp. Proc., 152, 227–232, 1989.*

Schwyn, "Sputter Deposition of Epitaxial Waveguiding KNbO3 Thin Films", App. Phys. Letters, 61, 373=375, Jul. 27, 1992.*

Yuhuan Xu et al., "Ferroelectric thin films on silicon and fused silica substrates by sol–gel process", pp. 13–18, Material Res. Soc. Symp. Proc., vol. 200, Apr. 16–20, 1990.

S.L. Swartz et al., "Ferroelectric thin films by sol–gel processing", pp. 227–232, Material Res. Soc. Symp. Proc. vol. 152, 1989. (No Month).

S. Schwyn Thony et al., "Sputter deposition of epitaxial waveguiding KNb03 thin films", pp. 373–375, Applied Physics Letters vol. 61, No. 4, Jul. 27, 1992.

* cited by examiner

*Primary Examiner*—Timothy M. Speer
(74) *Attorney, Agent, or Firm*—Young & Thompson

(57) ABSTRACT

A thin film of a perovskite-type transparent potassium niobate formed on an amorphous substrate. The thin film of a perovskite-type potassium niobate has excellent transparency, can be (110) oriented, and can be used for optical devices, such as an optical waveguide, a second harmonic generating device, and an optical switching device.

7 Claims, 2 Drawing Sheets

THIN FILM OF POTASSIUM NIOBATE PROCESS FOR PRODUCING THE THIN FILM AND OPTICAL DEVICE USING THE THIN FILM

CROSS-REFERENCE TO RELATED APPLICATIONS

This application is a division of application Ser. No. 08/688,273, filed Jul. 29, 1996 now U.S. Pat. No. 5,824,419.

FIELD OF THE INVENTION

The present invention relates to a thin film of potassium niobate, a process for producing the thin film, and an optical device using the thin film. Particularly, the present invention relates to a thin film of a perovskite-type transparent potassium niobate which can be used in the field of optical devices, electronic devices, and the like. More particularly, the present invention relates to a thin film of a perovskite-type potassium niobate which is formed on an amorphous substrate, has excellent transparency, and is or is not (110) oriented, a process for producing the thin film, and an optical device using the thin film.

PRIOR ART OF THE INVENTION

Heretofore, thin films of potassium niobate have been prepared on crystalline substrates of $KTaO_3$, $MgAl_2O_4$, and (100) MgO by process (Appl. Phys. Lett., Volume 61, Page 373 (1992), and Appl. Phys. Lett., Volume 65, Page 1073 (1994)), and on cyrstalline substrates of (100) MgO and (0001) sapphire by a sol-gel process (J. Am. Ceram. Soc., Volume 77, Page 820 (1994)).

When a thin film of potassium niobate is prepared on a crystalline substrate, the thin film grows only on a specific surface of the crystal. Therefore, free selection of the refractive index of the substrate is impossible when the substrate is used as a part of a cladding of an optical waveguide. Moreover, preparation of a finely processed surface with high precision is not easy because the specific surface of the crystalline substrate should be exposed.

SUMMARY OF THE INVENTION

The present invention has an object of providing a thin film of the perovskite-type potassium niobate which has excellent transparency, can be (110) oriented, and can be used for optical devices, such as an optical waveguide, a second harmonic generating device, and an optical switching device.

As the result of extensive studies by the present inventors to achieve the above object, it was discovered that a thin film of a transparent perovskite-type potassium niobate can be prepared on a substrate when the thin film of potassium niobate is prepared on an amorphous substrate, and that a transparent oriented thin film of a perovskite-type potassium niobate is easily prepared on an amorphous substrate when the amorphous substrate has a specific composition. The present invention has been completed on the basis of above mentioned discoveries.

Accordingly, the present invention provides:

(1) A thin film of a perovskite-type transparent potassium niobate formed on an amorphous substrate;

(2) The thin film of a perovskite-type transparent potassium niobate described in (1), wherein the thin film formed on an amorphous substrate is (110) oriented;

(3) The thin film of a perovskite-type transparent potassium niobate described in (1), wherein the amorphous substrate is a glass substrate containing at least one element selected from the group consisting of alkaline earth metal elements, rare earth elements, Bi, Pb, Nb, Co, Ni, and W;

(4) The thin film of a perovskite-type transparent potassium niobate described in (2) wherein the amorphous substrate is a glass substrate containing at least one element selected from the group consisting of alkaline earth metal elements, rare earth elements, Bi, Pb, and Nb;

(5) The thin film of a perovskite-type transparent potassium niobate described in (1), wherein the amorphous substrate is a composite amorphous substrate comprising an amorphous layer which contains at least one element selected from the group consisting of alkaline earth metal elements, rare earth elements, Bi, Pb, Nb, Co, Ni, and W, and is formed on a crystalline, amorphous, or crystalline-amorphous composite substrate;

(6) The thin film of a perovskite-type transparent potassium niobate described in (2), wherein the amorphous substrate is a composite amorphous substrate comprising an amorphous layer which contains at least one element selected from the group consisting of alkaline earth metal elements, rare earth elements, Bi, Pb, and Nb, and is formed on a crystalline, amorphous, or crystalline-amorphous composite substrate;

(7) The thin film of a perovskite-type transparent potassium niobate described in any of (3) and (4), wherein the glass substrate has a pattern of fine grooves or ridges;

(8) The thin film of a perovskite-type transparent potassium niobate described in any of (5) and (6), wherein the composite amorphous substrate comprises the amorphous layer formed on a patterned substrate in which a fine pattern of strips of metal electrodes is formed on a crystalline, amorphous, or crystalline-amorphous composite substrate by patterning;

(9) The thin film of a perovskite-type transparent potassium niobate described in any of (5) and (6), wherein the composite amorphous substrate comprises the amorphous layer formed on a crystalline, amorphous, or crystalline-amorphous composite substrate having a pattern of fine grooves or ridges;

(10) A process for producing a thin film of a perovskite-type transparent potassium niobate comprising preparing the thin film of a perovskite-type transparent potassium niobate on an amorphous substrate by a physical vapor deposition process;

(11) The process for producing a thin film of a perovskite-type transparent potassium niobate described in (10), wherein the physical vapor deposition process is a sputtering process;

(12) The process for producing a thin film of a perovskite-type transparent potassium niobate described in any of (10) and (11), wherein the thin film prepared on an amorphous substrate is (110) oriented;

(13) The process for producing a thin film of a perovskite-type transparent potassium niobate described in any of (10) and (11), wherein the amorphous substrate is a glass substrate containing at least one element selected from the group consisting of alkaline earth metal elements, rare earth elements, Bi, Pb, Nb, Co, Ni, and W;

(14) The process for producing a thin film of a perovskite-type transparent potassium niobate described in (12), wherein the amorphous substrate is a glass substrate containing at least one element selected from the group consisting of alkaline earth metal elements, rare earth elements, Bi, Pb, and Nb;

(15) The process for producing a thin film of a perovskite-type transparent potassium niobate described in any of (10) and (11), wherein the process comprises preparing the thin film of a perovskite-type transparent potassium niobate on a composite amorphous substrate comprising an amorphous layer which contains at least one element selected from the group consisting of alkaline earth metal elements, rare earth elements, Bi, Pb, Nb, Co, Ni, and W, and is formed on a crystalline, amorphous, or crystalline-amorphous composite substrate by a process selected from the group consisting of a physical vapor deposition process, a sol-gel process, a chemical vapor deposition process, a liquid phase deposition process, and a thick film printing process;

(16) The process for producing a thin film of a perovskite-type transparent potassium niobate described in (12), wherein the process comprises preparing the thin film of a perovskite-type transparent potassium niobate on a composite amorphous substrate comprising an amorphous layer which contains at least one element selected from the group consisting of alkaline earth metal elements, rare earth elements, Bi, Pb, and Nb, and is formed on a crystalline, amorphous, or crystalline-amorphous composite substrate by a process selected from the group consisting of a physical vapor deposition process, a sol-gel process, a chemical vapor deposition process, a liquid phase deposition process, and a thick film printing process;

(17) An optical device comprising the thin film of a perovskite-type transparent potassium niobate prepared on an amorphous substrate described in any of (1) to (9);

(18) The optical device described in (17), wherein the optical device is an optical waveguide;

(19) The optical device described in (17), wherein the optical device is a second harmonic generating device; and

(20) The optical device described in (17), wherein the optical device is an optical switching device.

DETAILED DESCRIPTION OF THE INVENTION

Figure 1:
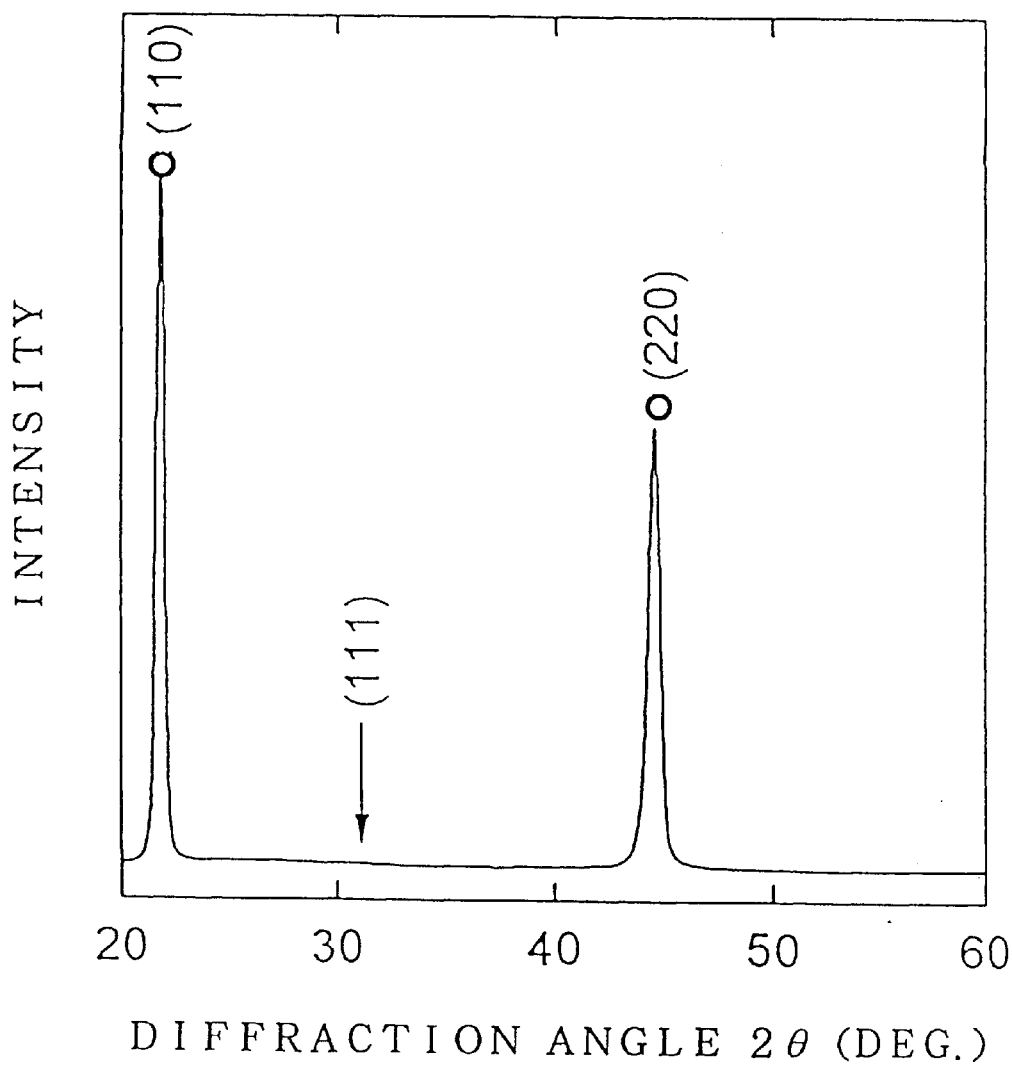
FIG. 1 shows an XRD pattern of a thin film of potassium niobate of the present invention.

The amorphous substrate used in the present invention is not particularly limited as long as a thin film of a transparent perovskite-type potassium niobate can be formed thereon. A glass substrate or a composite amorphous substrate comprising an amorphous layer formed on a substrate of ceramics, metal, glass, or a composite of these materials, viz. a substrate having an amorphous surface, can be used. Because the refractive index of the amorphous substrate can freely be selected, the thin film of a perovskite-type transparent potassium niobate of the present invention which is prepared on the amorphous substrate has advantages that the degree of freedom can be increased in the mode selection in the light propagation and that, unlike crystalline substrates, consideration on the orientation of surface for use of the substrate is not necessary. Moreover, by making the orientation of the thin film of a perovskite-type transparent potassium niobate (110), the thin film can be used as an optically anisotropic medium having an orientation to a specific direction. The (110) orientation means that the (110) plane of the thin film of potassium niobate is parallel to the surface of the substrate. The thin film of potassium niobate of the present invention can advantageously be used for various types of optical device, particularly as an optical waveguide, a second harmonic generating device, and an optical switch, by taking advantage of these properties.

In the present invention, a PVD process (a physical vapor deposition process) is preferred as the process for preparing the thin film of a perovskite-type transparent potassium niobate. The thin film can be prepared, for example, by a sputtering process or a molecular beam epitaxy process, or the like. In the sputtering process, for example, a thin film of a perovskite-type transparent potassium niobate can be prepared on an amorphous substrate by the radio frequency magnetron sputtering in argon-oxygen gas using a target which is silica glass coated with a mixture of a potassium niobate powder and a potassium carbonate powder.

In the present invention, a glass substrate containing at least one element selected from the group consisting of alkaline earth metal elements, such as Ba, Sr, Ca, and Mg, rare earth elements, such as La, Y, Gd, and Yb, Bi, Pb, Nb, Co, Ni, and W can be used as the amorphous substrate. Examples of the glass substrate include glass substrates of $SiO_2$—$Al_2O_3$—$BaO$—$B_2O_3$ glasses, $SiO_2$—$Al_2O_3$—$BaO$—$CaO$ glasses, $SiO_2$—$Al_2O_3$—$BaO$—$SrO$ glasses, $SiO_2$—$Al_2O_3$—$CaO$—$La_2O_3$ glasses, $SiO_2$—$Al_2O_3$—$BaO$—$B_2O_3$—$Bi_2O_3$ glasses, $SiO_2$—$Al_2O_3$—$BaO$—$PbO$ glasses, $SiO_2$—$Al_2O_3$—$BaO$—$MgO$ glasses, $SiO_2$—$Al_2O_3$—$B_2O_3$—$CoO$ glasses, $SiO_2$—$Al_2O_3$—$B_2O_2$—$Nb_2O_5$ glasses, $SiO_2$—$Al_2O_3$—$B_2O_3$—$NiO$ glasses, and $SiO_2$—$Al_2O_3$—$B_2O_3$—$WO_3$ glasses. A thin film of a perovskite-type transparent potassium niobate having a high degree of transparency can be prepared by using the glass substrate described above.

In the present invention, a thin film of a perovskite-type transparent potassium niobate having the (110) orientation can be prepared on an amorphous substrate by using the glass substrate containing at least one element selected from the group consisting of alkaline earth metal elements, such as Ba, Sr, Ca, and Mg, rare earth elements, such as La, Y, Gd, and Yb, Bi, Pb, and Nb as the amorphous substrate. Examples of the glass substrate include glass substrates of $SiO_2$—$Al_2O_3$—$BaO$—$B_2O_3$ glasses, $SiO_2$—$Al_2O_3$—$BaO$—$CaO$ glasses, $SiO_2$—$Al_2O_3$—$BaO$—$SrO$ glasses, $SiO_2$—$Al_2O_3$—$CaO$—$La_2O_3$ glasses, $SiO_2$—$Al_2O_3$—$BaO$—$B_2O_3$— $Bi_2O_3$ glasses, $SiO_2$—$Al_2O_3$—$BaO$—$PbO$ glasses, $SiO_2$—$Al_2O_3$—$BaO$—$MgO$ glasses, and $SiO_2$—$Al_2O_3$—$B_2O_2$—$Nb_2O_5$ glasses. A thin film of a perovskite-type transparent potassium niobate film having a high degree of transparency and intensely (110) oriented can be prepared by using the glass substrate described above. When the thin film of a perovskite-type transparent potassium niobate which is (110) oriented is prepared, high performance optical devices can be produced by using the prepared thin film of potassium niobate.

In the present invention, the fraction of the total of the oxides of elements selected from the group consisting of alkaline earth metal elements, such as Ba, Sr, Ca, and Mg, rare earth elements, such as La, Y, Gd, and Yb, Bi, Pb, Nb, Co, Ni, and W in the total oxides constituting the glass substrate is preferably 0.01 to 70% by mol, more preferably 1.0 to 50% by mol. This fraction is the mol fraction calculated, for example, as $BaO/(SiO_2+Al_2O_3+BaO+B_2O_3)$ in the $SiO_2$—$Al_2O_3$—$BaO$—$B_2O_3$ glasses, and as $(CaO+La_2O_3)/(SiO_2+Al_2O_3+CaO+La_2O_3)$ in the $SiO_2$—$Al_2O_3$—$CaO$—$La_2O_3$ glasses. When the fraction of the total of the oxides of elements selected from the group consisting of alkaline earth metal elements, such as Ba, Sr, Ca, and Mg, rare earth elements, such as La, Y, Gd, and Yb, Bi, Pb, Nb, Co, Ni, and W in the total oxides constituting the glass substrate is less than 0.01% by mol or more than 70% by mol, there is the possibility that the thin film of perovskite-type potassium niobate having a high degree of transparency cannot be obtained. The degree of the (110) orientation and the crystal grain size of the thin film of the perovskite-type transparent potassium niobate can be controlled by adjusting the mol ratios of the elements in the glass substrate.

In the present invention, a composite amorphous substrate prepared by forming an amorphous layer containing at least one element selected from the group consisting of alkaline earth metal elements, such as Ba, Sr, Ca, and Mg, rare earth elements, such as La, Y, Gd, and Yb, Bi, Pb, Nb, Co, Ni, and W on a crystalline, amorphous, or crystalline-amorphous composite substrate can be used as the amorphous substrate. The substrate on which the amorphous layer is formed is not particularly limited, and any substrate may be used as long as the substrate can support the amorphous layer and satisfies the properties such as heat resistance withstanding preparation of the amorphous layer and the thin film of potassium niobate. Examples of the crystalline substrate used for preparing the composite amorphous substrate include substrates of alumina, silicon, platinum, gallium-arsenic, and mullite. Examples of the amorphous substrate used for preparing the composite amorphous substrate include substrates of silica glass and borosilicate glass. Examples of the crystalline-amorphous composite substrate used for preparing the composite amorphous substrate include glass-ceramic composite substrates and ceramic-metal composite (cermet) substrates. Examples of the amorphous layer formed on the crystalline, amorphous, or crystalline-amorphous composite substrate include $SiO_2$—$Al_2O_3$—$BaO$—$B_2O_3$ amorphous layers, $SiO_2$—$Al_2O_3$—$BaO$—$CaO$ amorphous layers, $SiO_2$—$Al_2O_3$—$BaO$—$SrO$ amorphous layers, $SiO_2$—$Al_2O_3$—$CaO$—$La_2O_3$ amorphous layers, $SiO_2$—$Al_2O_3$—$BaO$—$B_2O_3$—$Bi_2O_3$ amorphous layers, $SiO_2$—$Al_2O_3$—$BaO$—$PbO$ amorphous layers, $SiO_2$—$Al_2O_3$—$BaO$—$MgO$ amorphous layers, $SiO_2$—$Al_2O_3$—$B_2O_3$—$CoO$ amorphous layers, $SiO_2$—$Al_2O_3$—$B_2O_3$—$Nb_2O_5$ amorphous layers, $SiO_2$—$Al_2O_3$—$B_2O_3$—$NiO$ amorphous layers, $SiO_2$—$Al_2O_3$—$B_2O_3$—$WO_3$ amorphous layers, $BaO$—$SiO_2$ amorphous layers, $SrO$—$SiO_2$ amorphous layers, $La_2O_3$—$SiO_2$ amorphous layers, $SrO$—$Al_2O_3$ amorphous layers, $Bi_2O_3$—$SiO_2$ amorphous layers, and $ZrO_2$—$BaO$—$La_2O_3$ amorphous layers. By using the composite amorphous substrate comprising the amorphous layer described above, a thin film of a perovskite-type transparent potassium niobate having a high degree of transparency can be prepared.

In the present invention, a thin film of the perovskite-type transparent potassium niobate which is (110) oriented can be prepared on an amorphous substrate by using a composite amorphous substrate provided by forming an amorphous layer containing at least one element selected from the group consisting of alkaline earth metal elements, such as Ba, Sr, Ca, and Mg, rare earth elements, such as La, Y, Gd, and Yb, Bi, Pb, and Nb on a crystalline amorphous, or crystalline-amorphous composite substrate as the amorphous substrate. The substrate on which the amorphous layer is formed is not particularly limited, and any substrate may be used as long as the substrate can support the amorphous layer and satisfies the properties such as heat resistance withstanding preparation of the amorphous layer and the thin film of potassium niobate. Examples of the crystalline substrate used for preparing the composite amorphous substrate include substrates of alumina, silicon, platinum, gallium-arsenic, and mullite. Examples of the amorphous substrate used for preparing the composite amorphous substrate include substrates of silica glass and borosilicate glass. Examples of the crystalline-amorphous composite substrate used for preparing the composite amorphous substrate include glass-ceramic composite substrates and ceramic-metal composite (cermet) substrates. Examples of the amorphous layer formed on the crystalline, amorphous, or crystalline-amorphous composite substrate include $SiO_2$—$Al_2O_3$—$BaO$—$B_2O_3$ amorphous layers, $SiO_2$—$Al_2O_3$—$BaO$—$CaO$ amorphous layers, $SiO_2$—$Al_2O_3$—$BaO$—$SrO$ amorphous layers, $SiO_2$—$Al_2O_3$—$CaO$—$La_2O_3$ amorphous layers, $SiO_2$—$Al_2O_3$—$BaO$—$B_2O_3$—$Bi_2O_3$ amorphous layers, $SiO_2$—$Al_2O_3$—$BaO$—$PbO$ amorphous layers, $SiO_2$—$Al_2O_3$—$BaO$—$MgO$ amorphous layers, $SiO_2$—$Al_2O_3$—$B_2O_3$—$Nb_2O_5$ amorphous layers, $BaO$—$SiO_2$ amorphous layers, $SrO$—$SiO_2$ amorphous layers, $La_2O_3$—$SiO_2$ amorphous layers, $SrO$—$Al_2O_3$ amorphous layers, $Bi_2O_3$—$SiO_2$ amorphous layers, and $ZrO_2$—$BaO$—$La_2O_3$ amorphous layers. By preparing the thin film of potassium niobate on the amorphous layer described above, a thin film of the perovskite-type transparent potassium niobate having a high degree of transparency and intensely (110) oriented can be prepared. When the thin film of a perovskite-type transparent potassium niobate which is (110) oriented is prepared, high performance optical devices can be produced by using the prepared thin film of potassium niobate.

In the present invention, the fraction of the total of the oxides of elements selected from the group consisting of alkaline earth metal elements, such as Ba, Sr, Ca, and Mg, rare earth elements, such as La, Y, Gd, and Yb, Bi, Pb, Nb, Co, Ni, and W in the total oxides constituting the amorphous layer is preferably 0.01 to 70% by mol, more preferably 1.0 to 50% by mol. This fraction is the mol fraction calculated, for example, as $Nb_2O_5/(SiO_2+Al_2O_3+B_2O_3+Nb_2O_5)$ in the $SiO_2$—$Al_2O_3$—$B_2O_3$—$Nb_2O_5$ amorphous layers, and as $(BaO+La_2O_3)/(ZrO_2+BaO+La_2O_3)$ in the $ZrO_2$—$BaO$—$La_2O_3$ amorphous layers. When the fraction of the total of the oxides of elements selected from the group consisting of alkaline earth metal elements, such as Ba, Sr, Ca, and Mg, rare earth elements, such as La, Y, Gd, and Yb, Bi, Pb, Nb, Co, Ni, and W in the total oxides constituting the amorphous layer is less than 0.01% by mol or more than 70% by mol, there is the possibility that the thin film of perovskite-type potassium niobate having a high degree of transparency cannot be obtained. The degree of the (110) orientation and the crystal grain size of the thin film of the perovskite-type transparent potassium niobate can be controlled by adjusting the mol ratios of the elements in the amorphous layer. In the present invention, the thickness of the amorphous layer in the composite amorphous substrate is preferably 1 nm or more, more preferably 10 nm or more.

In the present invention, the process for forming the amorphous layer on the crystalline, amorphous, or crystalline-amorphous composite substrate is not particularly limited, and a PVD process (a physical vapor deposition process) such as a sputtering process, a sol-gel process using or not using a metal alkoxide, a CVD process (a chemical vapor deposition process) such as a plasma CVD process and a thermal CVD process, an LPD process (a liquid phase deposition process), or a thick film printing process may be used.

The amorphous layer having the desired composition can also be formed by processes other than the above process in which the amorphous layer having the desired composition containing the effective elements is directly formed. For example, the amorphous layer having the desired composition containing the effective elements can be formed by a process in which a thin layer of oxides or metals of the effective elements is formed on a glass substrate not containing the effective elements or on an amorphous layer of a composite amorphous substrate not containing the effective elements by a PVD process such as a sputtering process, a sol-gel process using or not using a metal alkoxide, or a CVD process such as a plasma CVD process or a thermal CVD process in the form of a thin film or in the form of discontinuous islands, and the desired amorphous layer containing the effective elements is formed by subsequent thermal diffusion of the effective elements.

In the present invention, the amorphous substrate may have a pattern of fine grooves or ridges. When the amorphous substrate is a glass substrate, the pattern can be formed by wet etching using a combination of an aqueous solution of hydrofluoric acid and ammonium fluoride or a combination of an aqueous solution of hydrofluoric acid, ammonium fluoride, and sulfuric acid, or the like, sputter etching using argon ion or the like, or reactive ion etching using carbon tetrafluoride, fluoroform, or the like. A composite amorphous substrate having a fine pattern of ridges can be obtained by preparing a metal electrode on a crystalline, amorphous, or crystalline-amorphous composite substrate by patterning, followed by forming an amorphous layer thereon. A composite amorphous substrate having a pattern of fine grooves or ridges can be obtained by preparing a crystalline, amorphous, or crystalline-amorphous composite substrate having fine grooves or ridges by etching, or the like, followed by forming an amorphous layer thereon. When the amorphous substrate has a pattern of fine grooves or ridges, an optical device can easily be obtained by preparing the thin film of a perovskite-type transparent potassium niobate in accordance with the pattern.

An optical device such as an optical waveguide can easily be obtained also by preparing the thin film of a perovskite-type transparent potassium niobate on the amorphous substrate, and subsequently patterning the thin film of a perovskite-type transparent potassium niobate by sputter etching using argon ion, or the like.

Potassium niobate is transparent in the wave length from about 0.4 to about 4.5 $\mu$m, and absorption is practically zero in visible and near infrared region. Therefore, both incident light and generated secondary harmonic light can be transmitted with little attenuation. Moreover, because of its markedly large non-linear optical effect and electro-optic effect, potassium niobate can be used for optical devices of a reduced size, such as a thin film secondary harmonic generating device which yields efficient wavelength conversion from infrared to a blue or green region or an optical switching device of a waveguide-type.

To summarize the advantages of the present invention, the thin film of potassium niobate of the present invention is a thin film of a perovskite-type potassium niobate formed on an amorphous substrate, has excellent transparency, and can be (110) oriented. The amorphous substrate has a wide range in selecting the refractive index. Therefore, the thin film of potassium niobate of the present invention can be used for optical devices such as an optical waveguide, a secondary harmonic generating device, and an optical switching device.

The present invention is described in more detail with reference to examples in the following. However, the present invention is not limited by the examples.

EXAMPLE 1

A thin film of a perovskite-type transparent potassium niobate was prepared by the radio frequency magnetron sputtering using a substrate of an $SiO_2$—BaO—$Al_2O_3$—$B_2O_3$ glass (a product of Corning Inc., #7059 glass) as the amorphous substrate and a target of silica glass coated with mixed powder of $KNbO_3$ and $K_2CO_3$ (1:1 by mol) under the conditions of an argon pressure of 0.36 Pa, an oxygen pressure of 0.04 Pa, a substrate temperature of 500° C., a radio frequency power of 50 W, and a deposition time of 10 hours. The thickness of the prepared film was about 900 nm. FIG. 1 shows the XRD pattern of the prepared thin film of potassium niobate obtained by using the CuK$\alpha$ beam. The result in FIG. 1 shows that the thin film of the perovskite-type transparent potassium niobate was intensely (110) oriented.

When the light of He—Ne laser of a wavelength of 633 nm was introduced into the prepared thin film of potassium niobate by the prism coupling method, the light could be transmitted through the thin film. When a section of the film was polished and the light of semiconductor laser of a wavelength of 860 nm was introduced into the polished section of the film, a blue secondary harmonic generating light could be generated.

EXAMPLE 2

A composite amorphous substrate was prepared by forming an amorphous layer of CoO—$SiO_2$ having a thickness of about 50 nm on silicon by the radio frequency magnetron sputtering using a target of mixed powder of CoO and $SiO_2$ (1:5 by mol) under the conditions of an argon pressure of 0.72 Pa, an oxygen pressure of 0.08 Pa, a substrate temperature of 300° C., a radio frequency power of 50 W, and a deposition time of 15 minutes. The composite amorphous substrate prepared above was used as the amorphous substrate, and a thin film of a perovskite-type transparent potassium niobate having a thickness of about 350 nm was prepared on the composite amorphous substrate by the radio frequency magnetron sputtering using a target of silica glass coated with mixed powder of $KNbO_3$ and $K_2CO_3$ (1:1 by mol) under the conditions of an argon pressure of 0.36 Pa, an oxygen pressure of 0.04 Pa, a substrate temperature of 500° C., a radio frequency power of 50 W, and a deposition time of 3 hours.

EXAMPLE 3

A composite amorphous substrate was prepared by forming an amorphous layer of BaO—$SiO_2$ having a thickness of about 300 nm on silicon by the radio frequency magnetron sputtering using a target of mixed powder of $BaCO_3$ and $SiO_2$ (1:20 by mol) under the conditions of an argon pressure of 0.72 Pa, an oxygen pressure of 0.08 Pa, a substrate temperature of 300° C., a radio frequency power of 50 W, and a deposition time of 1 hour. The mol ratio BaO/(BaO+$SiO_2$) in this amorphous layer was 0.05. The composite amorphous substrate prepared above was used as the amorphous substrate, and a thin film of a perovskite-type transparent potassium niobate having a thickness of about 350 nm was prepared on the composite amorphous substrate by the radio frequency magnetron sputtering using a target of silica glass coated with mixed powder of $KNbO_3$ and $K_2CO_3$ (1:1 by mol) under the conditions of an argon pressure of 0.36 Pa, an oxygen pressure of 0.04 Pa, a substrate temperature of 500° C., a radio frequency power of 50 W, and a deposition time of 3 hours. The ratio of intensity of the (110) peak to that of the (111) peak obtained by the XRD pattern was about 10,000, and the obtained thin film of potassium niobate was shown to be intensely (110) oriented. The crystal grain size in this thin film of potassium niobate was found to be about 0.23 µm by the atomic force microscopy.

Four types of composite amorphous substrate comprising amorphous layers having $BaO/(BaO+SiO_2)$ (by mol ratio) of 0.01, 0.02, 0.09, and 0.17 were prepared by the radio frequency magnetron sputtering using powders of $BaCO_3$ and $SiO_2$ mixed in the corresponding ratios under the same conditions as those described above, and thin films of perovskite-type transparent potassium niobate were prepared on the composite amorphous substrates by the radio frequency magnetron sputtering using the same target as that described above under the same conditions as those described above.

Figure 2:
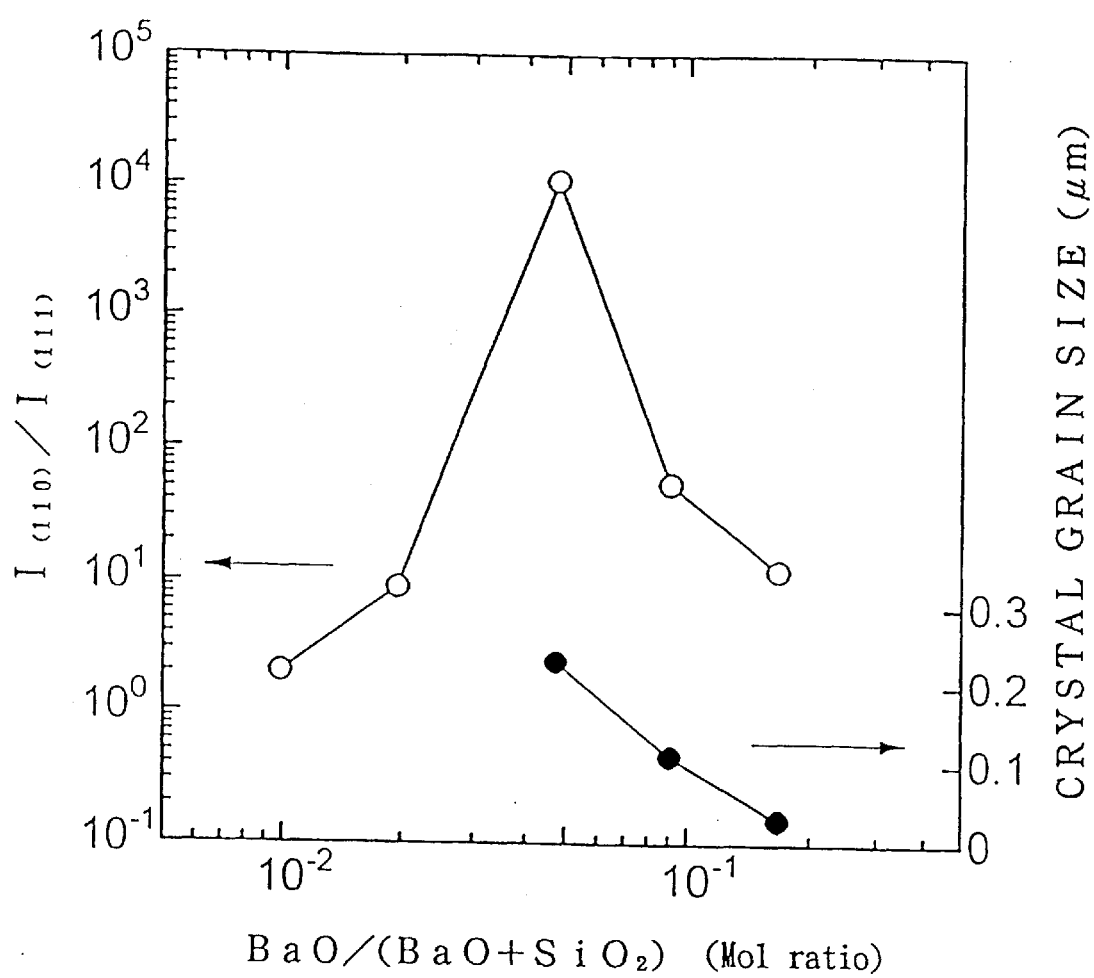
FIG. 2 shows a graphic representation exhibiting the ratios of intensity of the (110) peak to that of the (111) peak obtained from XRD patterns and the crystal grain sizes obtained by the atomic force microscopy which change depending on the composition of a substrate.

FIG. 2 shows the ratios of intensity of the (110) peak to that of the (111) peak obtained from XRD patterns and the crystal grain sizes obtained by the atomic force microscopy. It can be understood from the figure that the (110) orientation and the crystal grain size of the film of potassium niobate can be controlled by changing the ratio of BaO to $SiO_2$ in the amorphous layer.

EXAMPLE 4

A composite amorphous substrate was prepared by forming an amorphous layer of $ZrO_2$—BaO—$La_2O_3$ ($ZrO_2$:BaO:$La_2O_3$=40:2:1 by mol) having a thickness of about 100 nm on silica glass by the sol-gel process using $Zr(OCH_2CH_2CH_3)_4$, Ba metal, $CH_3OCH_2CH_2OH$, and $La(OCH_2CH_2OCH_3)_3$ as the raw materials. The composite amorphous substrate prepared above was used as the amorphous substrate, and a thin film of a perovskite-type transparent potassium niobate having a thickness of about 350 nm and (110) oriented was prepared on the composite amorphous substrate by the radio frequency magnetron sputtering using a target of silica glass coated with mixed powder of $KNbO_3$ and $K_2CO_3$ (1:1 by mol) under the conditions of an argon pressure of 0.36 Pa, an oxygen pressure of 0.04 Pa, a substrate temperature of 500° C., a radio frequency power of 50 W, and a deposition time of 3 hours.

EXAMPLE 5

A composite amorphous substrate was prepared by forming an amorphous layer of $SiO_2$—BaO—SrO—CaO—$Al_2O_3$—$La_2O_3$ having a thickness of about 100 µm on alumina ceramic by screen printing and sintering using an $SiO_2$—BaO—SrO—CaO—$Al_2O_3$—$La_2O_3$ glass paste (the total of the alkaline earth metal oxides and $La_2O_3$:27% by mol). The composite amorphous substrate prepared above was used as the amorphous substrate, and a thin film of a perovskite-type transparent potassium niobate having a thickness of about 350 nm and (110) oriented was prepared on the composite amorphous substrate by the radio frequency magnetron sputtering using a target of silica glass coated with mixed powder of $KNbO_3$ and $K_2CO_3$ (1:1 by mol) under the conditions of an argon pressure of 0.36 Pa, an oxygen pressure of 0.04 Pa, a substrate temperature of 500° C., a radio frequency power of 50 W, and a deposition time of 3 hours.

EXAMPLE 6

An $SiO_2$—BaO—$Al_2O_3$—$B_2O_3$ glass (a product of Corning Inc., #7059 glass) substrate was treated with the wet etching by using a mixed solution of hydrofluoric acid (concentration: 50% by weight), an aqueous solution of ammonium fluoride (concentration: 40% by weight), and sulfuric acid (concentration: 97% by weight) in a mixing ratio by volume of 49:49:2 to form a pattern of grooves having a width of about 50 µm and a depth of about 0.5 µm. The patterned #7059 glass substrate prepared above was used as the amorphous substrate, and a thin film of a perovskite-type transparent potassium niobate having a thickness of about 350 nm and (110) oriented was prepared on the patterned #7059 glass substrate by the radio frequency magnetron sputtering using a target of silica glass coated with mixed powder of $KNbO_3$ and $K_2CO_3$ (1:1 by mol) under the conditions of an argon pressure of 0.36 Pa, an oxygen pressure of 0.04 Pa, a substrate temperature of 500° C., a radio frequency power of 50 W, and a deposition time of 3 hours.

EXAMPLE 7

An $SiO_2$ glass substrate was treated with the wet etching by using a mixed solution of hydrofluoric acid (concentration: 50% by weight) and an aqueous solution of ammonium fluoride (concentration: 40% by weight) in a mixing ratio by volume of 1:1 to form a pattern of grooves having a width of about 50 µm and a depth of about 0.5 µm. A composite amorphous substrate was prepared by forming an amorphous layer of PbO—$SiO_2$ having a thickness of about 80 nm on the patterned $SiO_2$ glass prepared above by the radio frequency magnetron sputtering using a target of mixed powder of PbO and $SiO_2$ (1:5 by mol) under the conditions of an argon pressure of 0.72 Pa, an oxygen pressure of 0.08 Pa, a substrate temperature of 300° C., a radio frequency power of 50 W, and a deposition time of 15 minutes. The composite amorphous substrate prepared above was used as the amorphous substrate, and a thin film of a perovskite-type transparent potassium niobate having a thickness of about 350 nm and (110) oriented was prepared on the composite amorphous substrate by the radio frequency magnetron sputtering using a target of silica glass coated with mixed powder of $KNbO_3$ and $K_2CO_3$ (1:1 by mol) under the conditions of an argon pressure of 0.36 Pa, an oxygen pressure of 0.04 Pa, a substrate temperature of 500° C., a radio frequency power of 50 W, and a deposition time of 3 hours.

EXAMPLE 8

A substrate was prepared by forming a layer of SrO on an $SiO_2$ glass by the radio frequency magnetron sputtering using a target of $SrCO_3$ powder under the conditions of an argon pressure of 0.72 Pa, an oxygen pressure of 0.08 Pa, a substrate temperature of a room temperature, a radio frequency power of 50 W, and a deposition time of 60 seconds. A composite amorphous substrate was prepared by forming an amorphous layer of SrO—$SiO_2$ on the surface of the prepared substrate by thermal diffusion at 500° C. for 2 hours. The composite amorphous substrate prepared above was used as the amorphous substrate, and a thin film of a perovskite-type transparent potassium niobate having a thickness of about 350 nm and (110) oriented was prepared on the composite amorphous substrate by the radio frequency magnetron sputtering using a target of silica glass coated with mixed powder of $KNbO_3$ and $K_2$ $CO_3$ (1:1 by mol) under the conditions of an argon pressure of 0.36 Pa, an oxygen pressure of 0.04 Pa, a substrate temperature of 500° C., a radio frequency power of 50 W, and a deposition time of 3 hours.

EXAMPLES 9 to 24

Composite amorphous substrates comprising the amorphous layers shown in Table 1 were prepared in accordance with the same procedures as those in Example 2 except that the deposition time of the amorphous layer was 1 minute in Example 9 and 1 hour in Example 11. Thin films of potassium niobate were prepared on the prepared composite amorphous substrates also in accordance with the same procedures as those in Example 2.

The transparency and the crystal structure of the obtained thin film of potassium niobate were examined. When the thin film was found to have the perovskite-type structure, the degree of the (110) orientation was evaluated. The results are shown in Table 1. The thin films had all a thickness of about 350 nm.

COMPARATIVE EXAMPLES 1 to 3

Thin films of potassium niobate were prepared by using the substrates shown in Table 2 in accordance with the same procedures as those in Example 2 except that no amorphous layer was formed. The transparency and the crystal structure of the obtained thin film of potassium niobate were examined. When a thin film was found to have the perovskite-type structure, the degree of the (110) orientation was evaluated. The results are shown in Table 2.

intensely (110) oriented and transparent. The thin films obtained in Examples 23 and 24 was not intensely (110) oriented but transparent.

In contrast, the thin film of potassium niobate formed on the (100) Si single crystal substrate in Comparative Example 1 was a perovskite-type crystal, but not transparent. This thin film was not intensely (110) oriented, either. The thin film of potassium niobate formed on the platinum substrate in Comparative Example 2 was a perovskite-type crystal, but not transparent. This thin film was not intensely (110) oriented, either. The thin film of potassium niobate formed on SUS304 substrate in Comparative Example 3 was not either a perovskite-type crystal or transparent.

What is claimed is:

1. A process for producing a thin film of a perovskite-type transparent potassium niobate comprising depositing the thin film on an amorphous substrate by a physical vapor deposition process.

2. The process for producing a thin film of a perovskite-type transparent potassium niobate according to claim 1, wherein the physical vapor deposition process is a sputtering process.

3. The process for producing a thin film of a perovskite-type transparent potassium niobate according to claim 1,

TABLE 1

| | target for forming amorphous layer (ratio by mol) | | thickness of amorphous layer (nm) | transparency of film | perovskite-type | (110) orientation |
|---|---|---|---|---|---|---|
| Example 9  | SrO—SiO$_2$ | (1:10) | 10 | ○ | ○ | ○ |
| Example 10 | SrO—SiO$_2$ | (1:10) | 80 | ○ | ○ | ○ |
| Example 11 | SrO—SiO$_2$ | (1:10) | 300 | ○ | ○ | ○ |
| Example 12 | CaO—SiO$_2$ | (3:5) | 80 | ○ | ○ | ○ |
| Example 13 | MgO—SiO$_2$ | (1:1) | 100 | ○ | ○ | ○ |
| Example 14 | La$_2$O$_3$—SiO$_2$ | (1:10) | 70 | ○ | ○ | ○ |
| Example 15 | Bi$_2$O$_3$—SiO$_2$ | (1:10) | 80 | ○ | ○ | ○ |
| Example 16 | PbO—SiO$_2$ | (1:5) | 110 | ○ | ○ | ○ |
| Example 17 | Nb$_2$O$_5$—SiO$_2$ | (1:10) | 80 | ○ | ○ | ○ |
| Example 18 | Gd$_2$O$_3$—SiO$_2$ | (1:10) | 90 | ○ | ○ | ○ |
| Example 19 | Yb$_2$O$_3$—SiO$_2$ | (1:10) | 70 | ○ | ○ | ○ |
| Example 20 | Y$_2$O$_3$—SiO$_2$ | (3:10) | 50 | ○ | ○ | ○ |
| Example 21 | SrO—Al$_2$O$_3$ | (1:10) | 40 | ○ | ○ | ○ |
| Example 22 | BaO—Al$_2$O$_3$—SiO$_2$ | (1:1:5) | 80 | ○ | ○ | ○ |
| Example 23 | NiO—SiO$_2$ | (1:5) | 80 | ○ | ○ | × |
| Example 24 | WO$_3$—SiO$_2$ | (1:5) | 130 | ○ | ○ | × |

Notes:
transparency of film ○: transparent, ×: not transparent
perovskite-type ○: a perovskite-type crystal, ×: a crystal other than the perovskite type crystal
(110) orientation ○: I$_{(110)}$/I$_{(111)}$ ≧ 10, ×: I$_{(110)}$/I$_{(111)}$ < 10

TABLE 2

| | substrate | transparency of film | perovskite-type | (110) orientation |
|---|---|---|---|---|
| Comparative Example 1 | (100) Si single crystal | × | ○ | × |
| Comparative Example 2 | platinum | × | ○ | × |
| Comparative Example 3 | SUS304 | × | × | — |

Notes:
transparency of film ○: transparent, ×: not transparent
perovskite-type ○: a perovskite-type crystal, ×: a crystal other than the perovskite type crystal
(110) orientation ○: I$_{(110)}$/I$_{(111)}$ ≧ 10, ×: I$_{(110)}$/I$_{(111)}$ < 10

The thin films of potassium niobate of the present invention obtained in Examples 9 to 24 were all perovskite-type crystals. The thin films obtained in Examples 9 to 22 were wherein the thin film deposited on an amorphous substrate is (110) oriented.

4. The process for producing a thin film of a perovskite-type transparent potassium niobate according to claim 1, wherein the amorphous substrate is a glass substrate containing at least one element selected from the group consisting of alkaline earth metal elements, rare earth elements, Bi, Pb, Nb, Co, Ni, and W.

5. The process for producing a thin film of a perovskite-type transparent potassium niobate according to claim 3, wherein the amorphous substrate is a glass substrate containing at least one element selected from the group consisting of alkaline earth metal elements, rare earth elements, Bi, Pb, and Nb.

6. The process for producing a thin film of a perovskite-type transparent potassium niobate according to claim 1, wherein the process comprises depositing the thin film of a perovskite-type transparent potassium niobate on a composite amorphous substrate comprising an amorphous layer which contains at least one element selected from the group consisting of alkaline earth metal elements, rare earth elements, Bi, Pb, Nb, Co, Ni, and W, said amorphous layer having been formed on a crystalline, amorphous, or crystalline-amorphous composite substrate by a physical vapor deposition process, or a sol-gel process, or a chemical vapor deposition process, or a liquid phase deposition process, or a thick film printing process.

7. The process for producing a thin film of a perovskite-type transparent potassium niobate according to claim 3, wherein the process comprises depositing the thin film of a perovskite-type transparent potassium niobate on a composite amorphous substrate comprising an amorphous layer which contains at least one element selected from the group consisting of alkaline earth metal elements, rare earth elements, Bi, Pb, and Nb, said amorphous layer having been formed on a crystalline, amorphous, or crystalline-amorphous composite substrate by a physical vapor deposition process, or a sol-gel process, or a chemical vapor deposition process, or a liquid phase deposition process, or a thick film printing process.

* * * * *